United States Patent
Shih

(10) Patent No.: US 7,919,989 B2
(45) Date of Patent: Apr. 5, 2011

(54) CIRCUIT ARCHITECTURE FOR EFFECTIVE COMPENSATING THE TIME SKEW OF CIRCUIT

(75) Inventor: Jeng-Tzong Shih, Hsinchu (TW)

(73) Assignee: Etron Technology Inc., Hsinchu (TW)

( * ) Notice: Subject to any disclaimer, the term of this patent is extended or adjusted under 35 U.S.C. 154(b) by 0 days.

(21) Appl. No.: 12/757,505

(22) Filed: Apr. 9, 2010

(65) Prior Publication Data

US 2010/0327921 A1    Dec. 30, 2010

(30) Foreign Application Priority Data

Jun. 26, 2009    (TW) .............................. 98121634 A

(51) Int. Cl.
H03K 19/00    (2006.01)
(52) U.S. Cl. .............................. 326/93; 326/29; 327/155
(58) Field of Classification Search .............. 326/21–29, 326/93; 327/141–163; 714/700
See application file for complete search history.

(56) References Cited

U.S. PATENT DOCUMENTS

| | | | | |
|---|---|---|---|---|
| 6,340,905 B1 * | 1/2002 | Schultz | .......................... | 327/161 |
| 7,616,022 B2 * | 11/2009 | Hur et al. | .................. | 324/762.09 |
| 2006/0244505 A1 * | 11/2006 | Fung et al. | ..................... | 327/293 |
| 2009/0273381 A1 * | 11/2009 | Kim et al. | ...................... | 327/158 |
| 2010/0052745 A1 * | 3/2010 | Chung et al. | ................... | 327/149 |

* cited by examiner

*Primary Examiner* — Rexford N Barnie
*Assistant Examiner* — Jany Tran
(74) *Attorney, Agent, or Firm* — Muncy, Geissler, Olds & Lowe, PLLC

(57) ABSTRACT

A circuit architecture for effective compensating the time skew of circuit is disclosed. The circuit architecture comprises a required compensation circuit, two duplicated circuits, and a time skew detection and compensation circuit, wherein these duplicated circuits are the duplicates of the required compensation circuit. A differential of logic 0 and logic 1 signals are simultaneously inputted into two duplicated circuits to output a first detection signal and a second detection signal, then the time skew detection and compensation circuit detects the time skew between a first detection signal and a second detection signal so as to generate a compensation signal to the required compensation circuit. Accordingly, the time skew existed in the required compensation circuit can be reduced or eliminated.

12 Claims, 11 Drawing Sheets

CIRCUIT ARCHITECTURE FOR EFFECTIVE COMPENSATING THE TIME SKEW OF CIRCUIT

FIELD OF THE INVENTION

The present invention is related to a circuit architecture for effective compensating the time skew of circuit, used for reducing or eliminating the time skew existed in the required compensation circuit that applies the logic 0 and logic 1 signals.

BACKGROUND OF THE INVENTION

When the signal of the circuit is transmitted, the strengths of PMOS and NMOS transistors in the circuit (such as a CMOS circuit) are unable to match mutually as a result of the process shift or the voltage variation, therefore, the transmission speeds of the logic 0 signal and logic 1 signal in the circuit are different, in other words, a logic signal is transmitted faster, and another logic signal is oppositely transmitted more slowly, so that the time skew will be existed in the circuit, which may limit the high-speed transmission performance of the circuit.

Referring to FIG. 1, there is shown a circuit diagram for compensating the time skew of circuit of the prior art. The prior art will take an input buffer 10 as an example, which comprises a current mirror 101, a comparator 103, and an inverter 105.

Wherein the current mirror 101 is connected to a first voltage ($V_{DD}$), and consists of P1 and P2 PMOS transistors. The comparator 103 is connected to a second voltage ($V_{SS}$), connected with the current mirror 101 at a first node 102 and a second node 104, and consists of N1 and N2 NMOS transistors. Besides, the first node 102 is connected to the gates of P1 and P2 transistors of the current mirror 101, and the second node 104 is further connected to the inverter 105.

The comparator 103 is used for receiving and comparing an input signal and a reference signal to generate a comparative result, the comparative result is transmitted to the input terminal of the inverter 105, and then inverted by the inverter 105, so as to output an output signal from the output terminal of the inverter 105.

The compensation method of the input buffer 10 of the prior art is described as following: if the element characteristics of N1 and N2 transistors are much stronger than P1 and P2 transistors, the logic 1 signal will be transmitted faster and outputted from the inverter 105, in other words, the raising edge of the logic 1 signal will be transmitted to the output terminal of the inverter 105 ahead of time.

Furthermore, the voltage on the first node 102 can be formed with a lower potential because N1 transistor is stronger; then, the $V_{GS}$ voltages of P1 and P2 transistors will be increased according to the first node 102 having the lower potential to promote the strengths of P1 and P2 transistors. Thus, the falling edge of the logic 0 signal will be transmitted faster and outputted from the inverter 105 ahead of time to compensate the raising edge of the logic 1 signal that is transmitted quickly by the NMOS transistor. Thereby, the time skew existed in the input buffer 10 can be reduced.

Oppositely, the element characteristics of N1 and N2 transistors are much weaker than P1 and P2 transistors, the logic 1 signal will be transmitted slower and outputted from the inverter 105, in other words, the raising edge of the logic 1 signal will be transmitted to the output terminal of the inverter 105 behind of time.

Furthermore, the voltage on the first node 102 can be formed with a higher potential because N1 transistor is weaker; then, the $V_{GS}$ voltages of P1 and P2 transistors will be decreased according to the first node 102 having the higher potential to decrease the strengths of P1 and P2 transistors. Thus, the falling edge of the logic 0 signal will be transmitted slower and outputted from the inverter 105 behind time to compensate the raising edge of the logic 1 signal that is transmitted slowly by the NMOS transistor. Thereby, the time skew existed in the input buffer 10 can be reduced.

Although, the circuit design of the input buffer 10 of the prior art can be provided with the compensation function for the time skew, however, it is just a qualitative compensation not a quantitatively exact compensation, and after compensating, the time skew is still unable to reach the range that the circuit can be allowed. Moreover, the present working voltage ($V_{DD}$) becomes lower and lower, the operating range is smaller and smaller when the input buffer operates within the saturated area, such that the feedback compensation of the input buffer 10 is not easily commented.

SUMMARY OF THE INVENTION

It is one object of the present invention to provide a circuit architecture for effective compensating the time skew of circuit, inputting a differential of logic 0 and logic 1 signals to two duplicated circuits of a required compensation circuit to output a first detection signal and a second detection signal, detecting the time skew between the first detection signal and the second detection signal to generate a compensation signal, and then inputting the compensation signal to the required compensation circuit so as to reduce or eliminate the time skew existed in the required compensation circuit when the required compensation circuit applies the logic 0 and logic 1 signals.

To achieve the above object, the present invention provides a circuit architecture for effective compensating the time skew of circuit, comprising: a required compensation circuit used for receiving an input signal and a compensation signal to output an output signal; a first duplicated circuit used for receiving a first logic signal and the compensation signal to output a first detection signal; a second duplicated circuit used for receiving a second logic signal and the compensation signal to output a second detection signal; and a time skew detection and compensation circuit connected to the required compensation circuit, the first duplicated circuit and the second duplicated circuit, used for receiving the first detection signal and the second detection signal, and detecting the time skew between the first detection signal and the second detection signal to generate the compensation signal so as to compensate the time skew existed in the required compensation circuit; wherein the first duplicated circuit and the second duplicated circuit are the duplicates of the required compensation circuit, and the first logic signal and the second logic signal are a pair of differential signals.

DETAILED DESCRIPTION OF THE INVENTION

Figure 1:
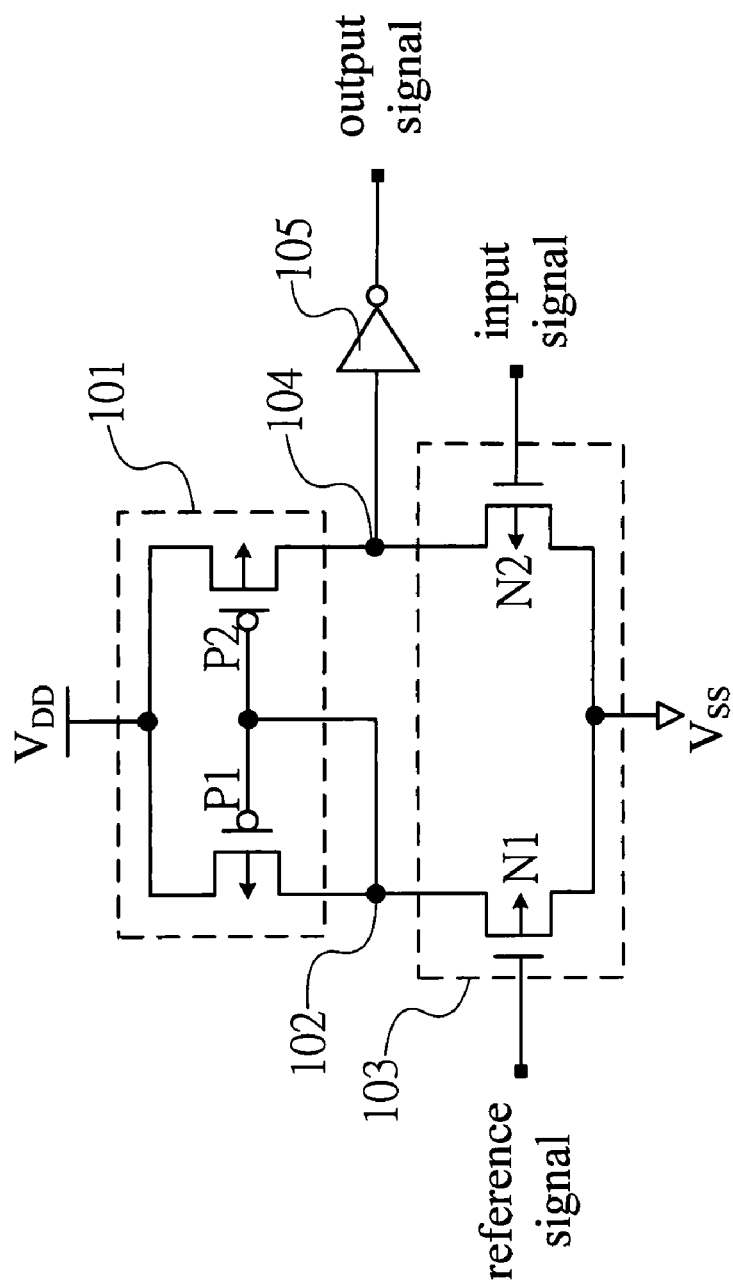
FIG. 1 shows a circuit diagram for compensating the time skew of circuit of the prior art.
Figure 2:
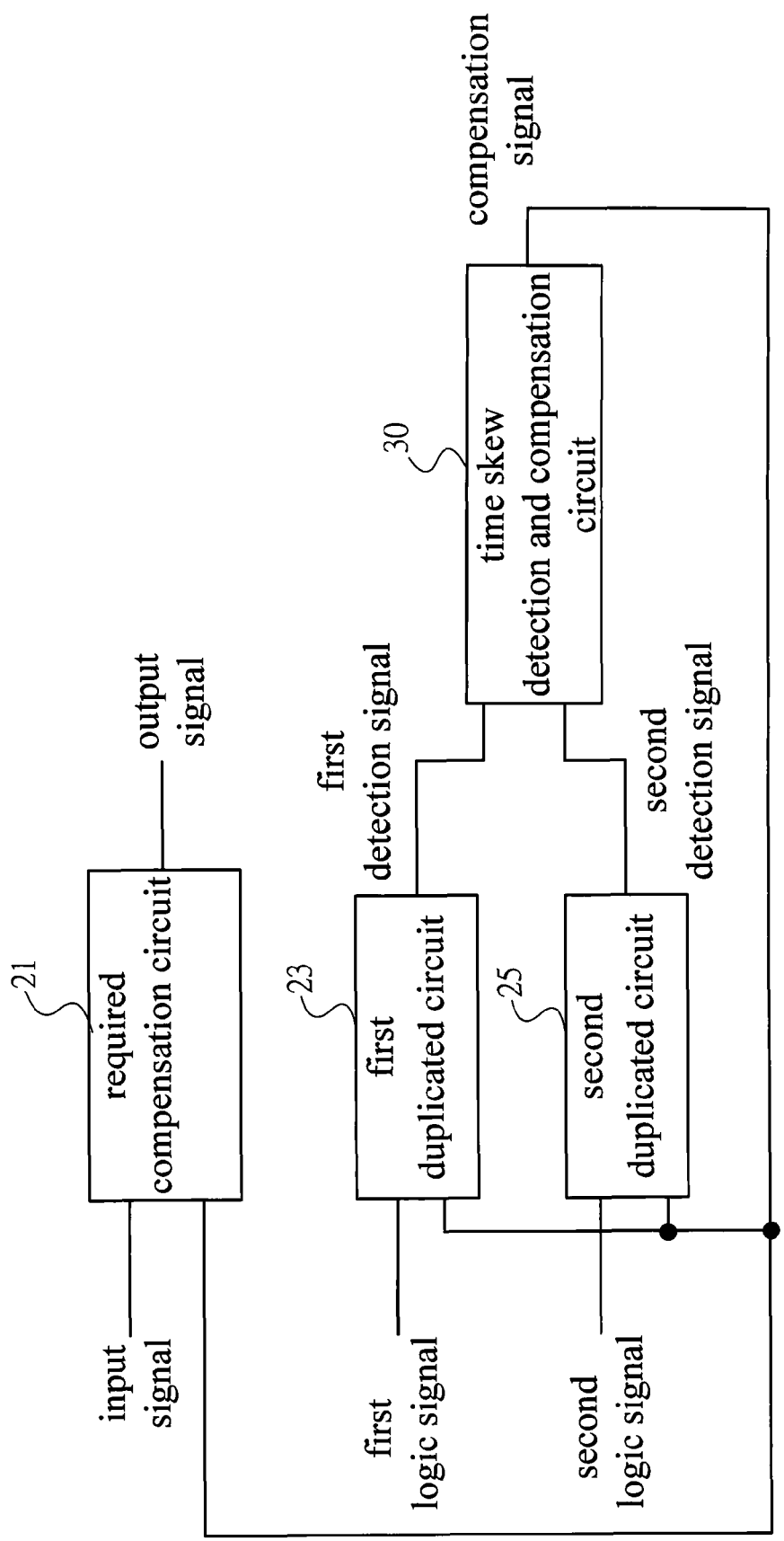
FIG. 2 shows a circuit diagram for compensating the time skew of circuit according to one embodiment of the present invention.

Referring to FIG. 2, there is shown a circuit diagram for compensating the time skew of circuit according to one embodiment of the present invention. The circuit architecture of the present invention comprises a required compensation circuit 21, a first duplicated circuit 23, a second duplicated circuit 25, and a time skew detection and compensation circuit 30.

Wherein, the required compensation circuit 21 is a circuit that requires compensating the time skew, which is used for receiving an input signal and a compensation signal. The time skew existed in the required compensation circuit 21 can be compensated according to the compensation signal so as to output an output signal currently.

The first duplicated circuit 23 and the second duplicated circuit 25 are the duplicates of the required compensation circuit 21 or the imitator of the required compensation circuit 21. The first duplicated circuit 23 is used for receiving a first logic signal and the compensation signal to output a first detection signal. The second duplicated circuit 25 is used for receiving a second logic signal and the compensation signal to output a second detection signal. The first logic signal and the second logic signal are a pair of differential signals, they are provided by an inside circuit or an application circuit (e.g., DDR SDRAM) that adopts the different signal as the duty cycle.

The time skew detection and compensation circuit 30 is connected to the required compensation circuit 21, the first duplicated circuit 23 and the second duplicated circuit 25, used for receiving the first detection signal and the second detection signal, and then detecting the time skew between the first detection signal and the second detection signal to generate the compensation signal, wherein the compensation signal will be inputted into the required compensation circuit 21, the first duplicated circuit 23 and the second duplicated circuit 25. Furthermore, the time skew detection and compensation 30 adjusts the magnitude of the compensation signal according to detecting the time skew between the first detection signal and the second detection signal, until the time skew is reduced to a range where can be allowed by the circuit operation, or further be eliminated as zero, so that the adjusted compensation signal can be used for precisely compensating the time skew existed in the required compensation circuit 21 that applies the logic 0 and logic 1 signals.

Figure 3:
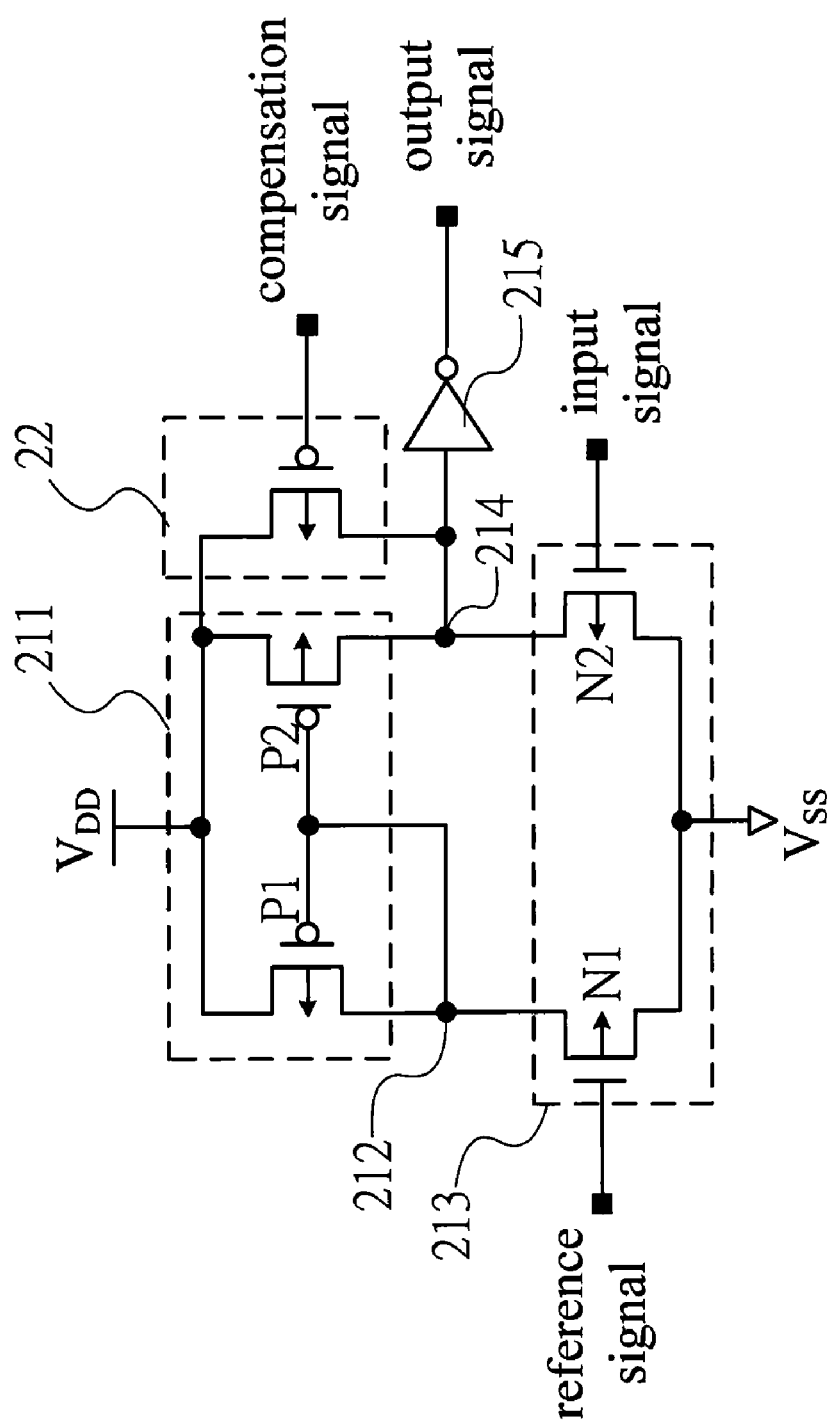
FIG. 3 shows a circuit diagram of the required compensation circuit of the present invention.
Figure 4:
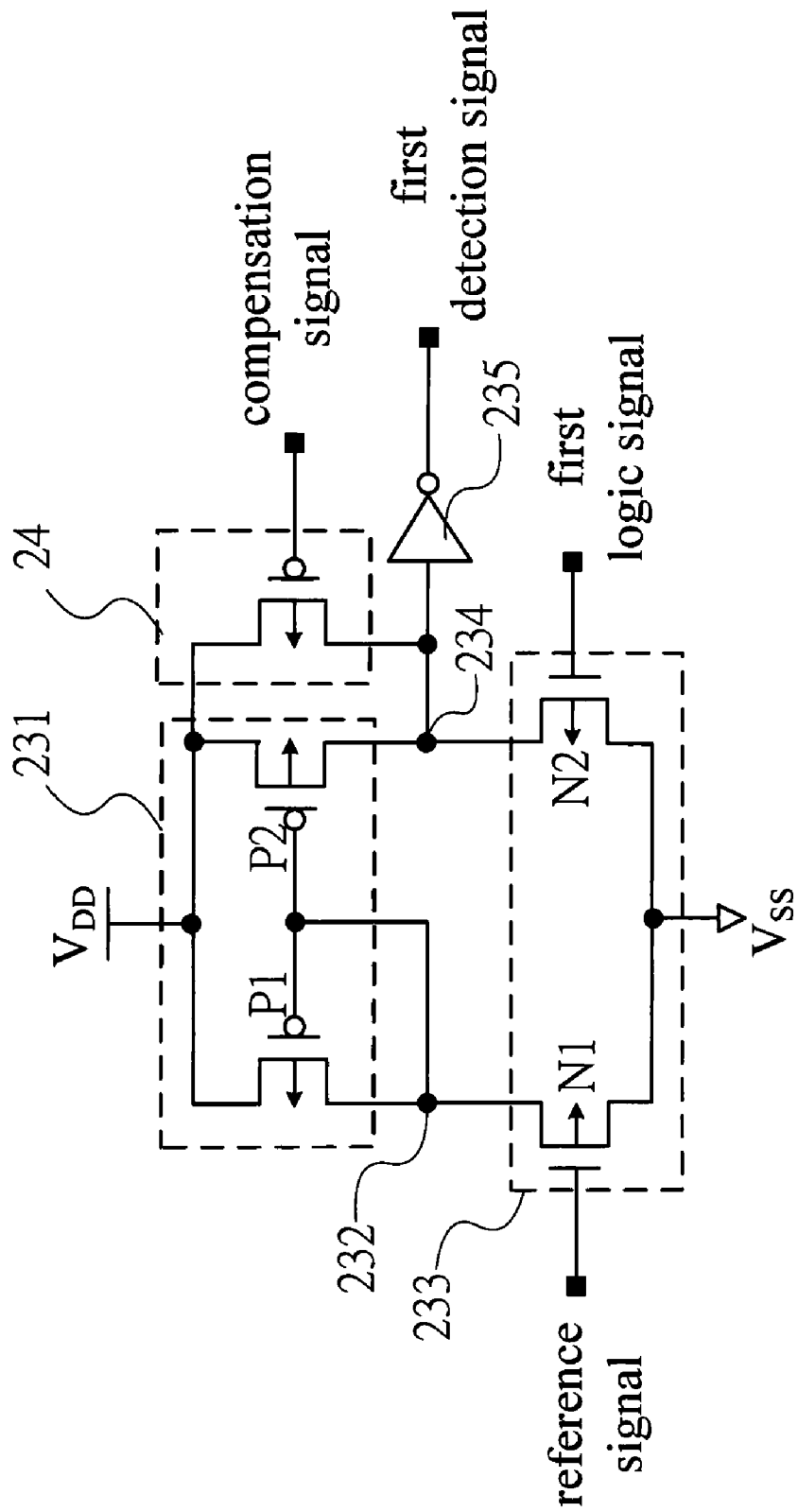
FIG. 4 shows a circuit diagram of the first duplicated circuit of the present invention.
Figure 5:
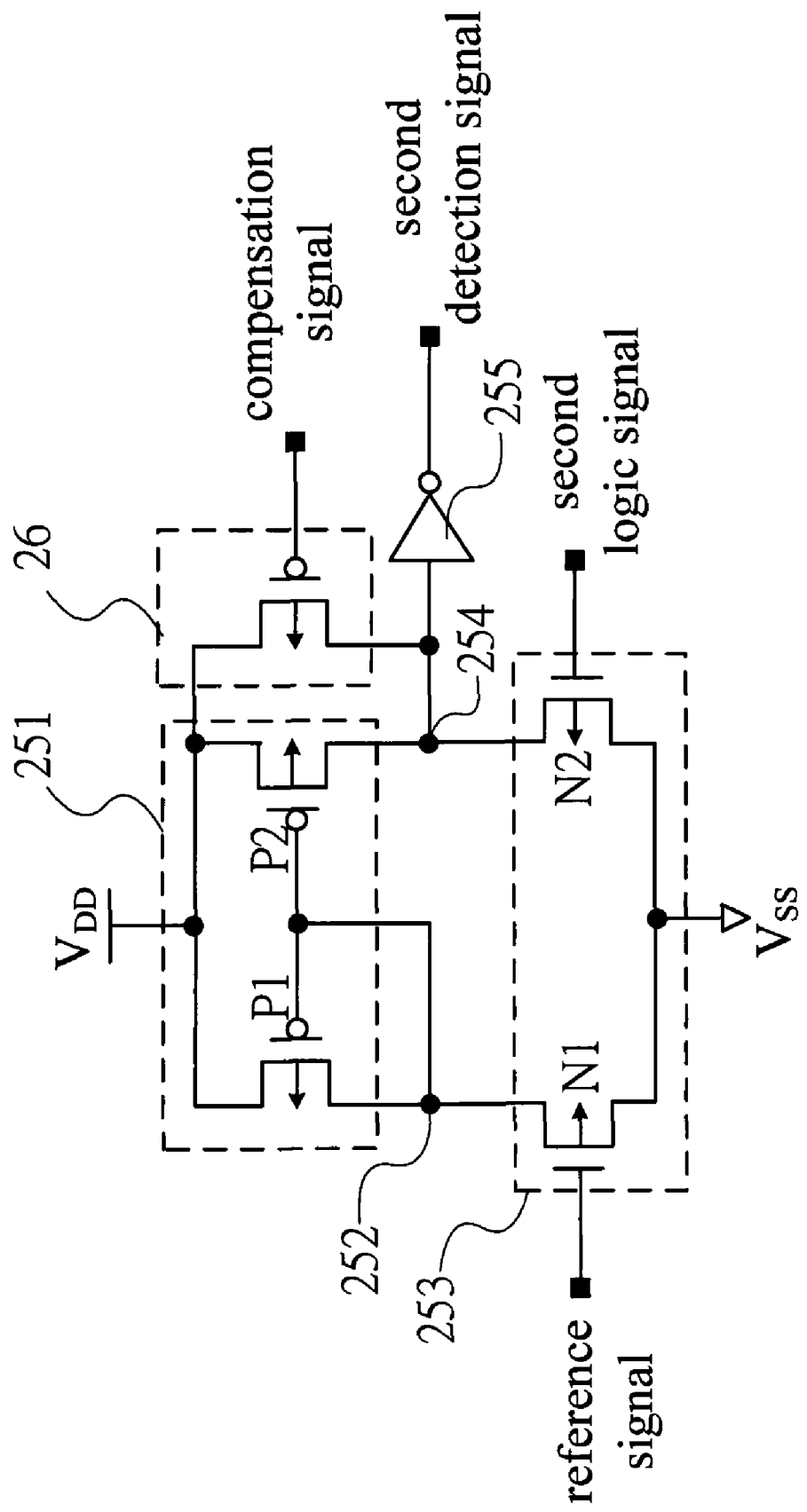
FIG. 5 shows a circuit diagram of the second duplicated circuit of the present invention.

Referring to FIG. 3, FIG. 4, and FIG. 5, there are respectively shown the circuit diagrams of the required compensation circuit, the first duplicated circuit, and the second duplicated circuit of the present invention. As shown in FIG. 3, FIG. 4, and FIG. 5, the structures of three circuits are identical, the first duplicated circuit 23 and the second duplicated circuit 25 are the duplicates of the required compensation circuit 21; the present invention will take an input buffer as an embodiment of the required compensation circuit 21, the first duplicated circuit 23, and the second duplicated circuit 25.

The required compensation circuit 21, the first duplicated circuit 23, and the second duplicated circuit 25 respectively comprise a current mirror 211/231/251, a comparator 213/233/253, and an inverter 215/235/255.

Wherein each current mirror 211/231/251 is connected to a first voltage ($V_{DD}$), and each one consists of P1 and P2 PMOS transistors.

Each comparator 213/233/253 is connected to a second voltage ($V_{SS}$), connected with each current mirror 211/231/251 at a first node 212/232/252 and a second node 214/234/254, and consists of N1 and N2 NMOS transistors. In addition, each first node 212/232/252 is connected to P1 and P2 gates of each current mirror 211/231/251, and each second node 214/234/254 is connected to each inverter 215/235/255.

The comparator 213 of the required compensation circuit 21 is used for receiving and comparing an input signal and a reference signal to generate a comparative result, the comparative result is transmitted to the input terminal of the inverter 215, and then inverted by the inverter 215, so as to output an output signal from the output terminal of the inverter 215.

The comparator 233 of the first duplicated circuit 23 is used for receiving and comparing a first logic signal and a reference signal to generate a comparative result, the comparative result is transmitted to the input terminal of the inverter 235, and then inverted by the inverter 235, so as to output a first detection signal from the output terminal of the inverter 235.

The comparator 253 of the second duplicated circuit 25 is used for receiving and comparing a second logic signal and a reference signal to generate a comparative result, the comparative result is transmitted to the input terminal of the inverter 255, and then inverted by the inverter 255, so as to output a second detection signal from the output terminal of the inverter 255.

The required compensation circuit 21, the first duplicated circuit 23, and the second duplicated circuit 25 further comprise a compensation unit 22/24/26, respectively. In the present embodiment, each compensation unit 22/24/26 is a PMOS transistor, connected between the first voltage ($V_{DD}$) and the second node 214/234/254, and connected, in parallel, to P2 PMOS transistor.

Figure 6:
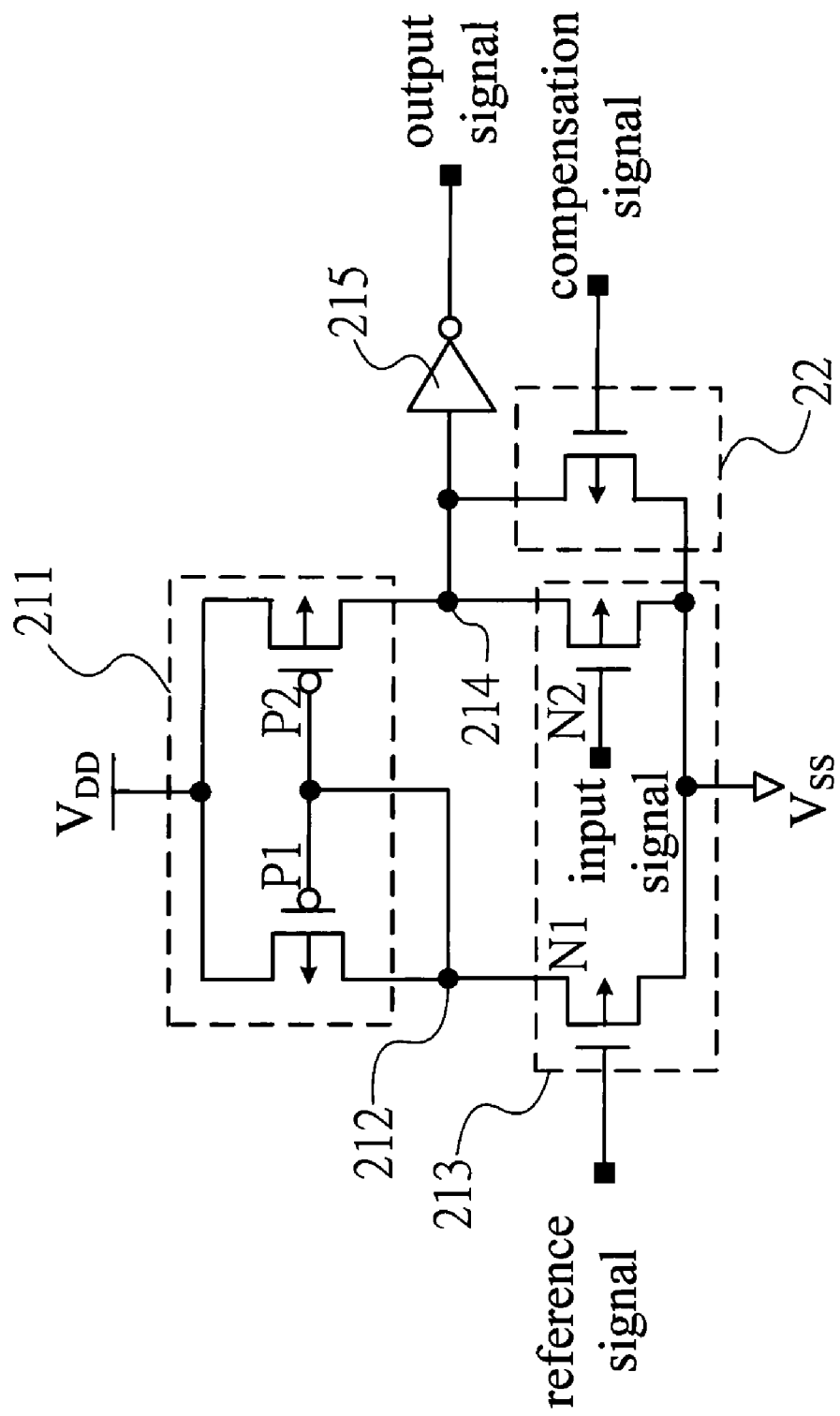
FIG. 6 shows a circuit diagram of the required compensation circuit of the present invention.
Figure 7:
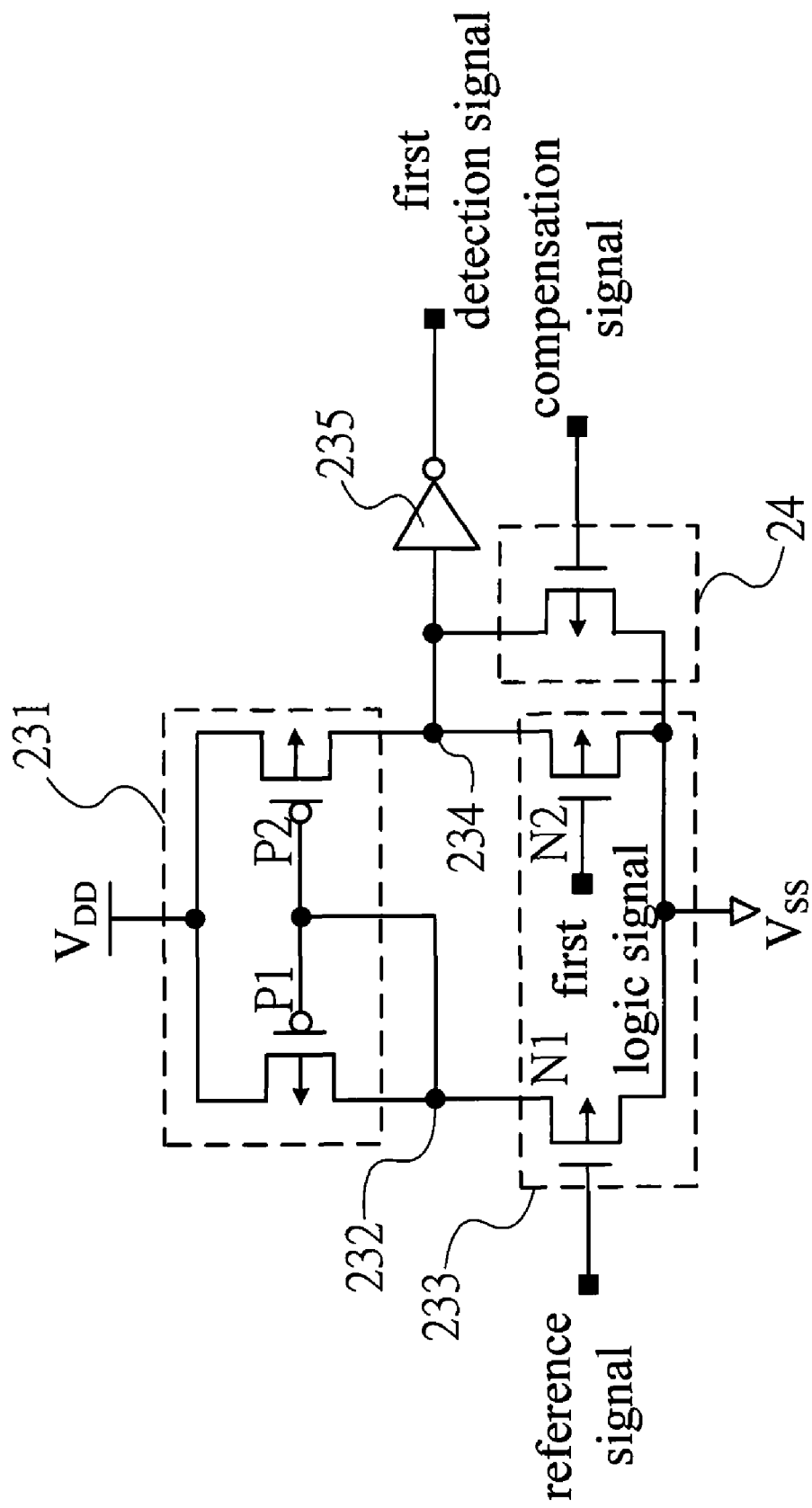
FIG. 7 shows a circuit diagram of the first duplicated circuit of the present invention.
Figure 8:
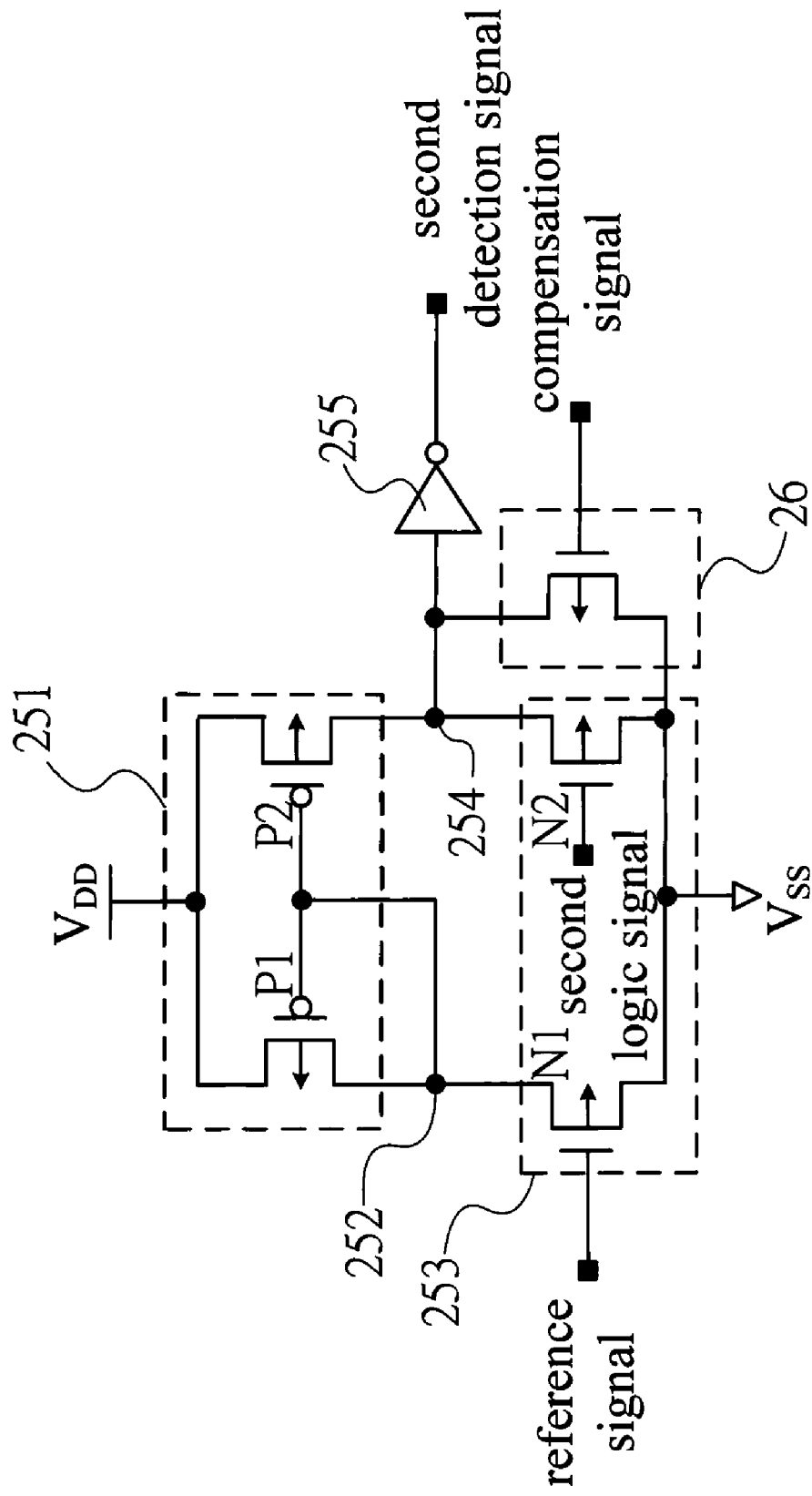
FIG. 8 shows a circuit diagram of the second duplicated circuit of the present invention.

Naturally, in another embodiment of the present invention, as shown in FIG. 6, FIG. 7, and FIG. 8, each compensation unit 22/24/26 may be a NMOS transistor, each one being connected between the second voltage ($V_{SS}$) and the second node 214/234/254, and connected, in parallel, to N2 NMOS transistor.

In addition, the compensation method for the required compensation circuit 21, the first duplicated circuit 23, and the second duplicated circuit 25 will be further described in the following diagram.

Figure 9:
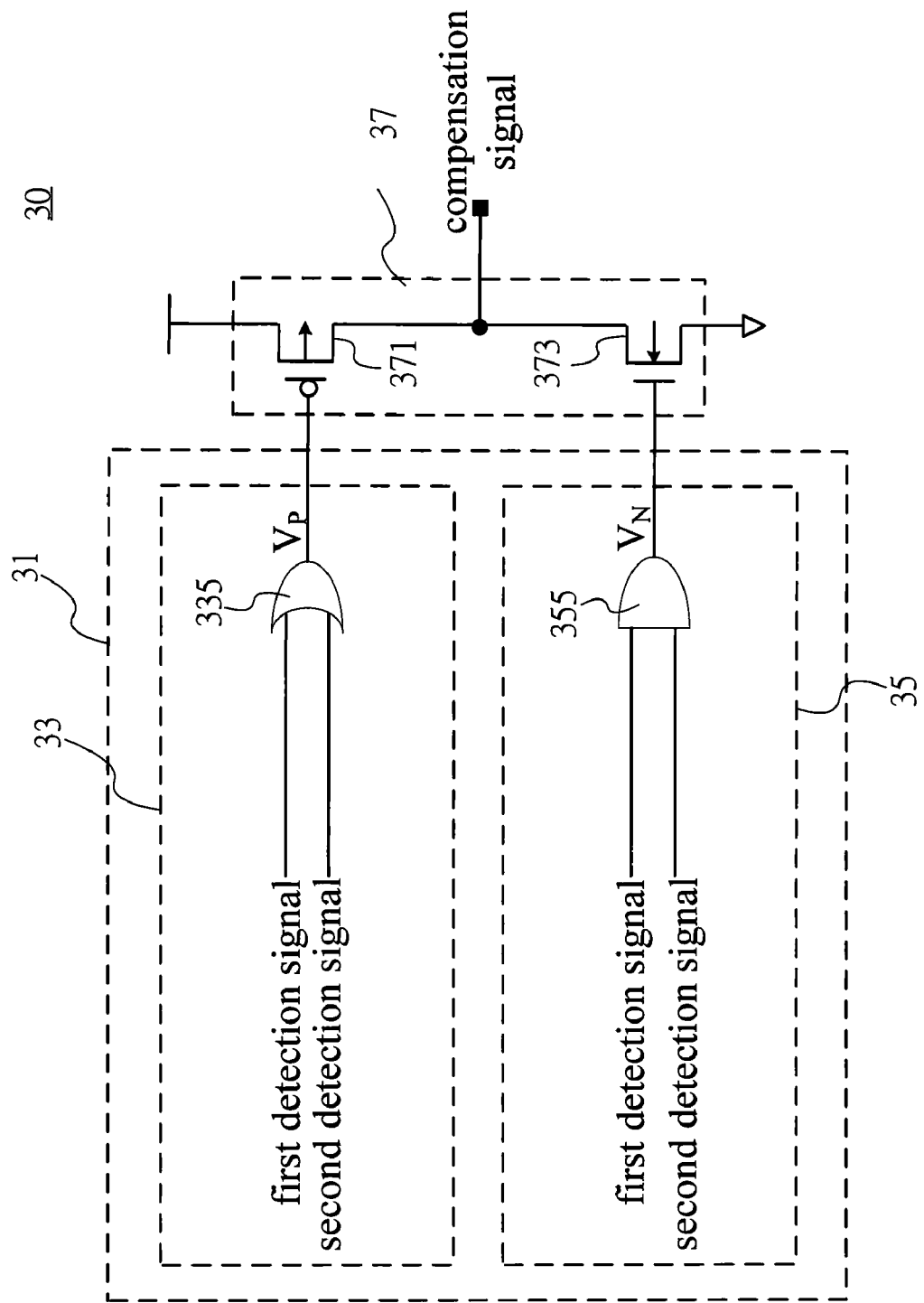
FIG. 9 shows a circuit diagram of the time skew detection and compensation circuit of the present invention.
Figure 10:
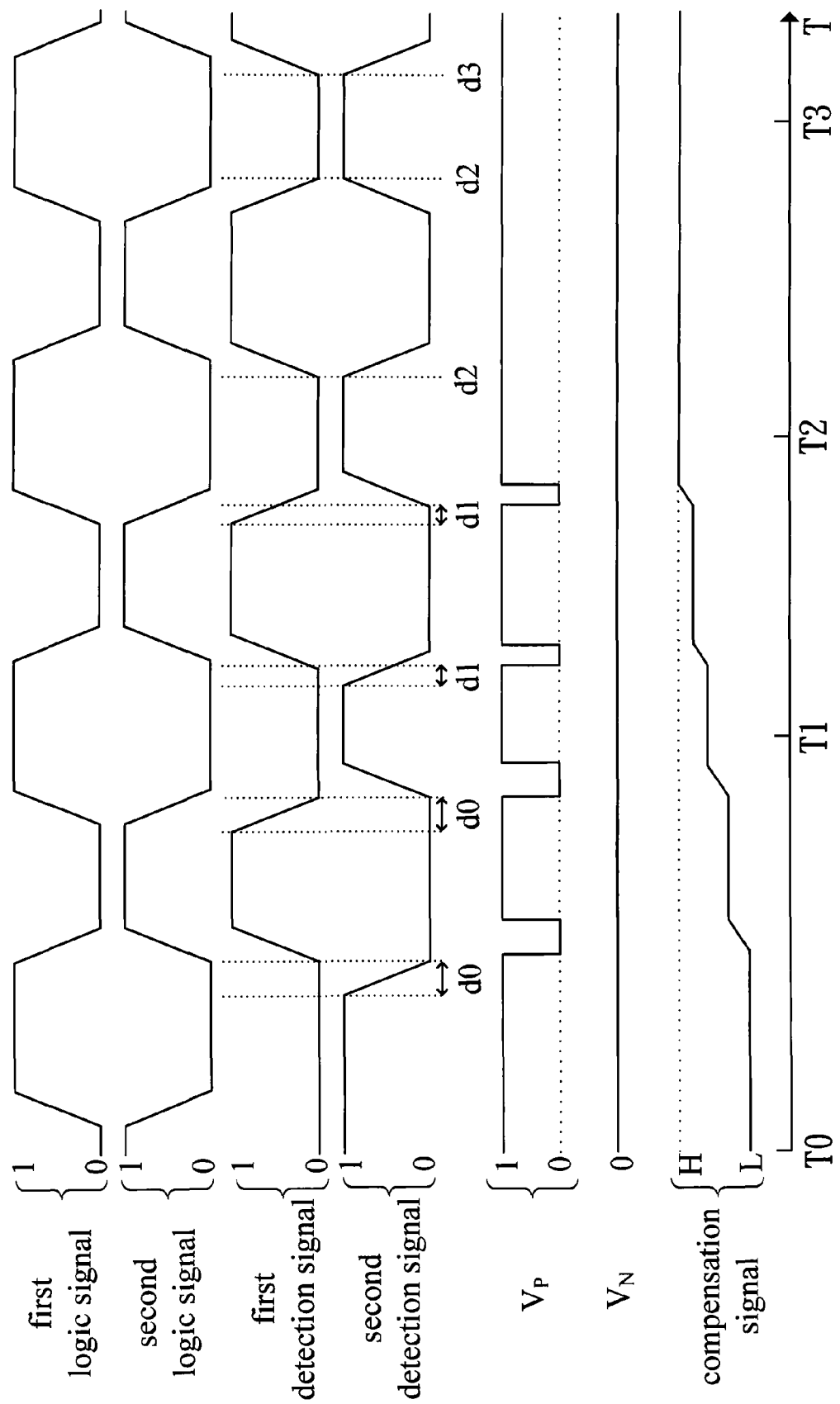
FIG. 10 shows a signal-timing diagram of a preferred embodiment of the present invention.

Referring to FIG. 9 and FIG. 10, there are shown a circuit diagram of the time skew detection and compensation circuit and a signal-timing diagram of a preferred embodiment of the present invention, accompanying with FIG. 3, FIG. 4 and FIG. 5.

The time skew detection and compensation circuit 30 comprises a time skew detector 31 and a compensation generator 37.

Wherein, the time skew detector 31 comprises a first detection unit 33 and a second detection unit 35. The first detection unit 33 is used for receiving the first detection signal and the second detection signal, thus detecting the time skew between the first detection signal and the second detection signal, and generating a first driving signal ($V_P$). The second detection unit 35 is used for receiving the first detection signal and the second detection signal, thus detecting the time skew between the first detection signal and the second detection signal, and generating a second driving signal ($V_N$).

The compensation generator 37 is connected to the time skew detector 31, and used for receiving the first driving signal ($V_P$) and the second driving signal ($V_N$) to generate the compensation signal.

The detailed structure of the first detection unit 33 comprises an OR gate 335 with two input terminals and one output terminal. The OR gate 335 is used for receiving the first detection signal and the second detection signal to output the first driving signal ($V_P$).

The detailed structure of the second detection unit 35 comprises an AND gate 355 with two input terminals and one output terminal. The AND gate 355 is used for receiving the first detection signal and the second detection signal to output the second driving signal ($V_N$).

The detailed structure of the compensation generator 37 comprises a first transistor 371 and a second transistor 373. The first transistor 371 is a PMOS transistor and used for receiving the first driving signal ($V_P$), the second transistor 373 is a NMOS transistor and used for receiving the second driving signal ($V_N$), and the compensation signal is generated on the connecting point between the first transistor 371 and the second transistor 373. When the first driving signal ($V_P$) is the low potential, the first transistor 371 will be driven to generate the compensation signal with the higher potential. Oppositely, when the second driving signal ($V_N$) is the high potential, the second transistor 373 will be driven to generate the compensation signal with the lower potential.

Subsequently, as illustrated in FIG. 3, FIG. 4, and FIG. 5, when the logic 0 signal is transmitted faster than the logic 1 signal in the required compensation 21, in other word, the falling edge of the logic 0 signal will be outputted ahead of time and the raising edge of the logic 1 signal will be outputted behind of time from the required compensation circuit 21, therefore, the time skew is existed in the required compensation circuit 21 that applies the logic 0 and logic 1 signals.

The present invention is to detect the existing time skew in the required compensation 21 that applies the logic 0 and logic 1 signals, a differential of the first logic and the second logic signals are simultaneously inputted into the first duplicated circuit 23 and the duplicated circuit 25. When the falling edge of the logic 0 of the first detection signal and the second detection signal are transmitted faster than the raising edge of the logic 1 of the first detection signal and the second detection signal in the first duplicated circuit 23 and the duplicated circuit 25, the time skew will be existed between the first detection signal and the second detection signal.

As shown in FIG. 10, during the first duty cycle (T1), the time skew (d0) will be existed between the first detection signal and the second detection signal. In the period of the time skew (d0), the first detection signal and the second detection signal are all in the state of the logic 0, the OR gate 335 of the first detection unit 33 will be outputted the first driving signal ($V_P$) with the logic 0, so as to drive the first transistor 371 operated in the ON state to generate the compensation signal with the higher potential. The AND gate 355 of the second detection unit 35 will be outputted the second driving signal ($V_N$) with the logic 0, in such a manner that it is unable to drive the second transistor 373 operated in the ON state.

Continuously, the compensation signal with the higher potential will be outputted into the compensation unit 22/24/26 of the required compensation circuit 21, the first duplicated circuit 23, and the duplicated circuit 25; then, the $V_{GS}$ voltages and the strengths of the compensation unit 22/24/26 can be decreased, so that the falling edge of the logic 0 signal of the first detection signal and the second detection signal will be transmitted slower and the raising edge of the logic 1 signal of the first detection signal and the second detection signal will be transmitted faster.

During the second duty cycle (T2), the time skew (d1) between the first detection signal and the second detection signal can be narrowed noticeably because of the compensation action. The circuit architecture of the present invention will continue compensating and promoting the intensity of the compensation signal, and then, during the third duty cycle (T3), the time skew (d2) between the first detection signal and the second detection signal becomes zero by the compensation method of the present invention. Thus, now, the adjusted compensation signal can be used for precisely compensating the time skew existed in the required compensation circuit 21 when it applies the differential signals.

Figure 11:
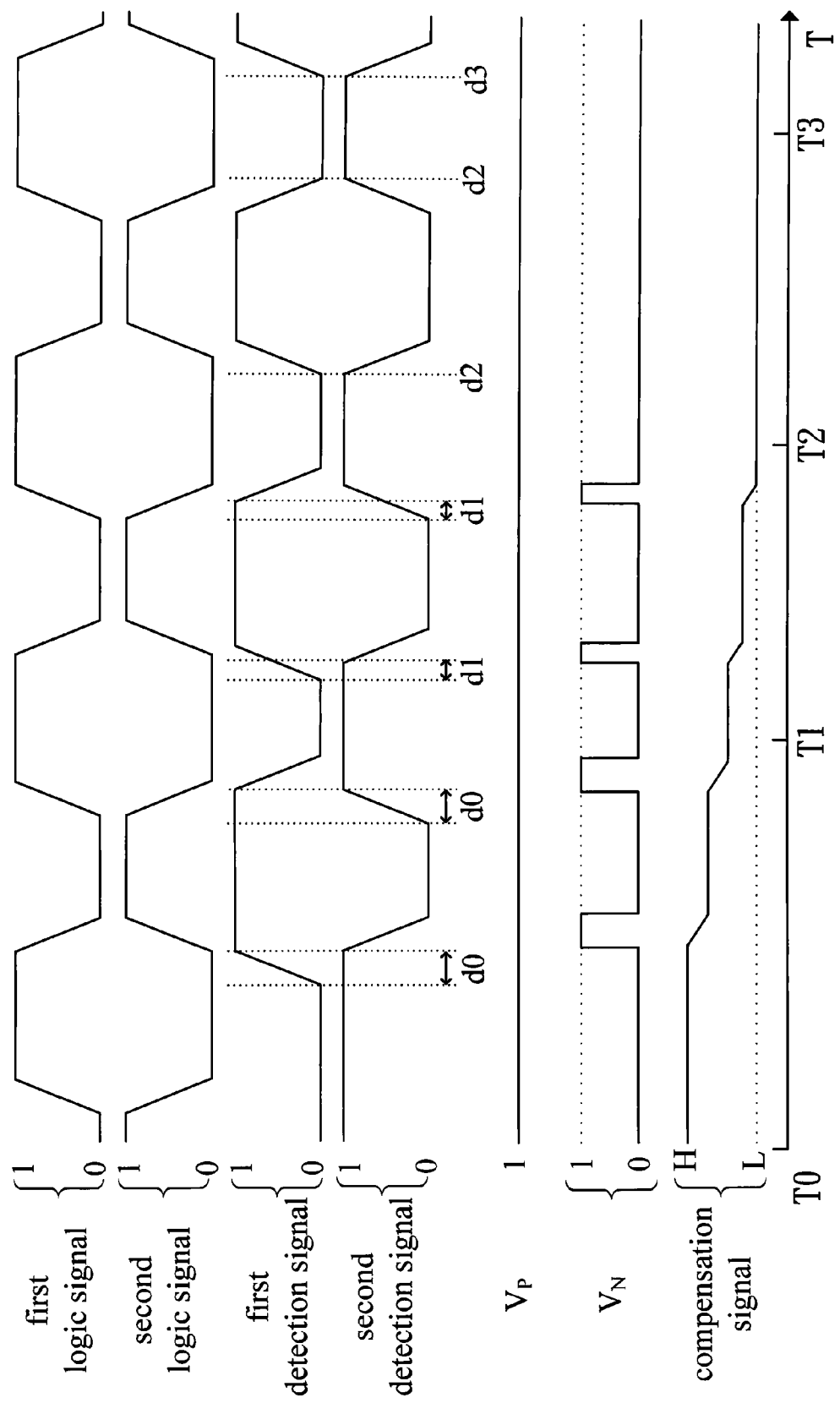
FIG. 11 shows a signal-timing diagram of another embodiment of the present invention.

Further, referring to FIG. 11, there is shown a signal-timing diagram of another embodiment of the present invention, accompanying with FIG. 6, FIG. 7, FIG. 8 and FIG. 9.

As shown in FIG. 6, FIG. 7, and FIG. 8, the required compensation circuit 21, the first duplicated circuit 23 and the second duplicated circuit 25 further comprise a compensation unit 22/24/26, respectively. Each compensation unit 22/24/26 is a NMOS transistor, connected between the second voltage ($V_{SS}$) and the second node 214/234/254, and connected to the N2 transistor in parallel.

When the logic 1 signal is transmitted faster than the logic 0 signal in the required compensation circuit 21, in other words, the raising edge of the logic 1 signal will be outputted from the required compensation circuit 21 ahead of time, and the falling edge of the logic 0 signal will be outputted from the required compensation circuit 21 behind of time. A differential of the first logic and the second logic signals are simultaneously inputted into the first duplicated circuit 23 and the duplicated circuit 25; the raising edge of the logic 1 of the first detection signal and the second detection signal are transmitted faster than the falling edge of the logic 0 of the first detection signal and the second detection signal in the first duplicated circuit 23 and the duplicated circuit 25. The time skew will be existed between the first detection signal and the second detection signal.

As shown in FIG. 11, during, during the first duty cycle (T1), the time skew (d0) will be existed between the first detection signal and the second detection signal. In the period of the time skew (d0), the first detection signal and the second detection signal are all in the state of logic 1, the OR gate 335 of the first detection unit 33 will be outputted the first driving signal ($V_P$) with the logic 1, such that it is unable to drive the first transistor 371 operated in the ON state, and the AND gate 355 of the second detection unit 35 will be outputted the second driving signal ($V_N$) with the logic 1, so as to drive the second transistor 373 operated in the ON state to generate the compensation signal with the lower potential.

Continuously, the compensation signal with the lower potential will be outputted to the compensation unit 22/24/26 of the required compensation circuit 21, the first duplicated circuit 23, and the duplicated circuit 25; then, the $V_{GS}$ voltages and the strengths of the compensation unit 22/24/26 can be decreased, so that the raising edge of the logic 1 signal of the first detection signal and the second detection signal will be transmitted slower and the falling edge of the logic 0 signal of the first detection signal and the second detection signal will be transmitted faster.

During the second duty cycle (T2), the time skew (d1) between the first detection signal and the second detection signal can be narrowed noticeably because of the compensation action. The circuit architecture of the present invention will continue compensating and promoting the intensity of the compensation signal, and then during the third duty cycle (T3), the time skew (d2) between the first detection signal and the second detection signal becomes zero by the compensation method of the present invention. Thus, now, the adjusted compensation signal can be used for precisely compensating the time skew existed in the required compensation circuit 21 when it applies the differential signals.

Although the required compensation circuit 21 of the present invention is described for an input buffer as an example, it is also possible to apply it to a circuit that adopts the differential signals as the input signals or the control signals, such as the date read/write circuit. Accordingly, the time skew existed in each circuit can be reduced or eliminated.

The foregoing description is merely one embodiment of the present invention and should not be considered as restrictive. All equivalent variations and modifications in shape, structure, feature, and spirit in accordance with the appended claims may be made without in any way deviating from the scope of the invention.

What is claimed is:

1. A circuit architecture for effective compensating the time skew of circuit, comprising:
    a required compensation circuit used for receiving an input signal and a compensation signal to output an output signal;
    a first duplicated circuit used for receiving a first logic signal and said compensation signal to output a first detection signal;
    a second duplicated circuit used for receiving a second logic signal and said compensation signal to output a second detection signal; and
    a time skew detection and compensation circuit connected to said required compensation circuit, said first duplicated circuit and said second duplicated circuit, used for receiving said first detection signal and said second detection signal, and detecting the time skew between said first detection signal and said second detection signal to generate said compensation signal so as to compensate the time skew existed in said required compensation circuit;
    wherein said first duplicated circuit and said second duplicated circuit are the duplicates of said required compensation circuit or the imitator of said required compensation circuit, and said first logic signal and said second logic signal are a pair of differential signals.

2. The circuit architecture of claim 1, wherein said required compensation circuit, comprising:
    a current mirror connected to a first voltage;
    a comparator connected to a second voltage, connected with said current mirror at a first node and a second node, used for receiving and comparing said input signal and a reference signal, wherein said first node is connected with the gate of each transistor of said current mirror;
    an inverter connected to said second node and used for outputting said output signal; and
    a compensation unit used for receiving said compensation signal, and connected between said first voltage and said second node or between said second voltage and said second node.

3. The circuit architecture of claim 2, wherein said compensation unit is a PMOS transistor or a NMOS transistor.

4. The circuit architecture of claim 1, wherein said first duplicated circuit, comprising:
    a current mirror connected to a first voltage;
    a comparator connected to a second voltage, connected with said current mirror at a first node and a second node, used for receiving and comparing said first logic signal and a reference signal, wherein said first node is connected with the gate of each transistor of said current mirror;
    an inverter connected to said second node and used for outputting said first detection signal; and
    a compensation unit used for receiving said compensation signal, and connected between said first voltage and said second node or between said second voltage and said second node.

5. The circuit architecture of claim 4, wherein said compensation unit is a PMOS transistor or a NMOS transistor.

6. The circuit architecture of claim 1, wherein said second duplicated circuit, comprising:
    a current mirror connected to a first voltage;
    a comparator connected to a second voltage, connected with said current mirror at a first node and a second node, and used for receiving and comparing said second logic signal and a reference signal, wherein said first node is connected with the gate of each transistor of said current mirror;
    an inverter connected to said second node and used for outputting said second detection signal; and
    a compensation unit used for receiving said compensation signal, and connected between said first voltage and said second node or between said second voltage and said second node.

7. The circuit architecture of claim 6, wherein said compensation unit is a PMOS transistor or a NMOS transistor.

8. The circuit architecture of claim 1, wherein said time skew detection and compensation circuit, comprising:
    a time skew detector, comprising:
        a first detection unit used for receiving said first detection signal and said second detection signal, detecting the time skew between said first detection signal and said second detection signal, and generating a first driving signal; and
        a second detection unit used for receiving said first detection signal and said second detection signal, detecting the time skew between said first detection signal and said second detection signal, and generating a second driving signal; and
    a compensation generator connected to said time skew detector, and used for receiving said first driving signal and said second driving signal to generate said compensation signal.

9. The circuit architecture of claim 8, wherein said first detection unit, comprising:
    an OR gate comprising two input terminals and one output terminal, and used for receiving said first detection signal and said second detection signal to generate said first driving signal.

10. The circuit architecture of claim 8, wherein said second detection unit, comprising:
    an AND gate comprising two input terminals and one output terminal, and used for receiving said first detection signal and said second detection signal to generate said second driving signal.

11. The circuit architecture of claim 8, wherein said compensation generator, comprising:

a first transistor used for receiving said first driving signal; and a second transistor used for receiving said second driving signal, wherein said compensation signal is generated on the connecting point between said first transistor and said second transistor;

wherein when said first driving signal is a low potential, said first transistor will be driven to generate said compensation signal with a higher potential, and when said second driving signal is a high potential, said first transistor will be driven to generate said compensation signal with a lower potential.

12. The circuit architecture of claim 11, wherein said first transistor is a PMOS transistor, and said second transistor is a NMOS transistor.

* * * * *